US010146604B2

(12) United States Patent
Rudy et al.

(10) Patent No.: US 10,146,604 B2
(45) Date of Patent: Dec. 4, 2018

(54) BAD BLOCK DETECTION AND PREDICTIVE ANALYTICS IN NAND FLASH STORAGE DEVICES

(71) Applicant: Oracle International Corporation, Redwood City, CA (US)

(72) Inventors: David Rudy, Stoneham, MA (US); George Kechriotis, Arlington, MA (US); Patrick O'Grady, Chelmsford, MA (US); James Gemmell, Ottawa (CA)

(73) Assignee: Oracle International Corporation, Redwood City, CA (US)

( * ) Notice: Subject to any disclaimer, the term of this patent is extended or adjusted under 35 U.S.C. 154(b) by 277 days.

(21) Appl. No.: 15/244,190

(22) Filed: Aug. 23, 2016

(65) Prior Publication Data
US 2018/0060148 A1     Mar. 1, 2018

(51) Int. Cl.
| | |
|---|---|
| *G06F 11/00* | (2006.01) |
| *G06F 11/07* | (2006.01) |
| *G06F 11/20* | (2006.01) |
| *G11C 29/38* | (2006.01) |
| *G11C 29/44* | (2006.01) |
| *G11C 29/52* | (2006.01) |

(52) U.S. Cl.
CPC ......... *G06F 11/076* (2013.01); *G06F 11/079* (2013.01); *G06F 11/0727* (2013.01); *G06F 11/0772* (2013.01); *G06F 11/2069* (2013.01); *G11C 29/38* (2013.01); *G11C 29/44* (2013.01); *G11C 29/52* (2013.01); *G06F 2201/805* (2013.01)

(58) Field of Classification Search
CPC ............ G11C 11/5628; G11C 11/5621; G11C 29/765; G11C 29/82; G11C 16/0483; G11C 16/16; G11C 16/349; G11C 16/04; G11C 16/06; G11C 16/08; G11C 16/344; G11C 16/3445; G06F 12/0669; G06F 12/0246; G06F 12/1425; G01R 31/318544
See application file for complete search history.

(56) References Cited

U.S. PATENT DOCUMENTS

| | | | |
|---|---|---|---|
| 6,381,174 B1 * | 4/2002 | Roohparvar | G11C 8/12 365/185.09 |
| 7,177,191 B2 * | 2/2007 | Fasoli | G11C 16/0483 257/E27.103 |
| 7,203,828 B2 | 4/2007 | Jordan et al. | |

(Continued)

*Primary Examiner* — Bryce P Bonzo
*Assistant Examiner* — Jeison C Arcos
(74) *Attorney, Agent, or Firm* — Marsh Fischmann & Breyfogle LLP; Jonathon A. Szumny

(57) ABSTRACT

Utilities for use in actively detecting the occurrence of bad blocks in NAND flash storage devices and diagnosing the devices as faulty at some point before complete failure of the devices (e.g., before a number of allowable bad blocks has been reached) to allow a corresponding service processor to continue to write to available blocks for a period of time until a replacement NAND flash device can be identified. The utilities may also be utilized to predict the future occurrence of bad blocks in NAND flash devices, such as during the "burn-in" process of the devices (e.g., which tests the quality of the NAND flash device before being placed into service to weed out devices with defects).

13 Claims, 4 Drawing Sheets

(56) References Cited

U.S. PATENT DOCUMENTS

| | | | | |
|---|---|---|---|---|
| 7,765,426 B2* | 7/2010 | Li | | G06F 11/073 714/6.13 |
| 7,873,885 B1* | 1/2011 | Shin | | G11C 29/56 365/185.33 |
| 8,156,343 B2 | 4/2012 | Robinson et al. | | |
| 8,285,919 B2 | 10/2012 | Luo et al. | | |
| 8,489,966 B2 | 1/2013 | Schuette et al. | | |
| 8,422,296 B2 | 4/2013 | Franca-Neto et al. | | |
| 8,631,273 B2 | 1/2014 | Frost et al. | | |
| 8,898,548 B1* | 11/2014 | Mullendore | | H03M 13/353 365/185.09 |
| 8,959,280 B2* | 2/2015 | Yu | | G06F 3/0608 711/103 |
| 8,966,330 B1* | 2/2015 | Raghu | | G11C 16/10 714/721 |
| 9,146,855 B2 | 9/2015 | Lambert et al. | | |
| 9,158,674 B2 | 10/2015 | Verhaeghe et al. | | |
| 2001/0052093 A1* | 12/2001 | Oshima | | G11C 29/56 714/719 |
| 2002/0099578 A1* | 7/2002 | Eicher, Jr. | | G06Q 10/06 705/7.39 |
| 2004/0080998 A1* | 4/2004 | Chang | | G11C 29/26 365/200 |
| 2005/0111259 A1* | 5/2005 | Fukuda | | G11C 16/16 365/185.11 |
| 2006/0018166 A1* | 1/2006 | Iaculo | | G11C 29/76 365/200 |
| 2006/0031710 A1* | 2/2006 | Jo | | G06F 12/0246 714/5.1 |
| 2006/0080515 A1* | 4/2006 | Spiers | | G06F 11/1441 711/162 |
| 2006/0109725 A1* | 5/2006 | Yoon | | G06F 12/0246 365/200 |
| 2006/0221728 A1* | 10/2006 | Fasoli | | G11C 29/76 365/200 |
| 2006/0221752 A1* | 10/2006 | Fasoli | | G11C 5/02 365/230.03 |
| 2006/0291304 A1* | 12/2006 | Rothman | | G11C 29/76 365/200 |
| 2007/0050777 A1* | 3/2007 | Hutchinson | | G06F 11/0709 718/104 |
| 2007/0253250 A1* | 11/2007 | Shibata | | G11C 11/5628 365/185.03 |
| 2007/0283428 A1* | 12/2007 | Ma | | G06F 11/1068 726/9 |
| 2007/0294588 A1 | 12/2007 | Coulson | | |
| 2008/0055989 A1* | 3/2008 | Lee | | G06F 11/1068 365/185.09 |
| 2008/0082736 A1* | 4/2008 | Chow | | G06F 12/0246 711/103 |
| 2008/0127104 A1* | 5/2008 | Li | | G06F 11/1072 717/126 |
| 2009/0013148 A1* | 1/2009 | Eggleston | | G06F 12/0246 711/203 |
| 2009/0259799 A1* | 10/2009 | Wong | | G06F 12/0207 711/103 |
| 2011/0078363 A1* | 3/2011 | Yeh | | G06F 12/0246 711/103 |
| 2012/0026775 A1* | 2/2012 | Yamada | | G11C 16/0483 365/94 |
| 2012/0151260 A1* | 6/2012 | Zimmermann | | G11C 16/3431 714/16 |
| 2012/0193785 A1* | 8/2012 | Lin | | H01L 21/76229 257/737 |
| 2013/0103992 A1* | 4/2013 | Chang | | G11C 29/06 714/718 |
| 2013/0145085 A1* | 6/2013 | Yu | | G06F 12/0246 711/103 |
| 2014/0006688 A1* | 1/2014 | Yu | | G11C 16/10 711/103 |
| 2014/0063952 A1* | 3/2014 | Hara | | G11C 16/0483 365/185.11 |
| 2014/0085982 A1* | 3/2014 | Asaoka | | G11C 16/06 365/185.17 |
| 2014/0157078 A1* | 6/2014 | Danilak | | H03M 13/09 714/758 |
| 2015/0106557 A1* | 4/2015 | Yu | | G11C 16/3431 711/103 |
| 2015/0325105 A1* | 11/2015 | Banerjee | | G06F 11/0772 340/506 |
| 2017/0005857 A1* | 1/2017 | Reiss | | H04L 41/0609 |

* cited by examiner

BAD BLOCK DETECTION AND PREDICTIVE ANALYTICS IN NAND FLASH STORAGE DEVICES

BACKGROUND

1. Field of the Invention

The present invention generally relates to storage devices and, more particularly, to solid state storage devices that utilize NAND (negative-AND) flash memory.

2. Relevant Background

Flash memory is a form of erasable and reprogrammable non-volatile integrated circuit memory. In a flash memory, memory cells are generally arranged in "blocks" for erasure. After a block has been erased, it is ready for programming if desired. For instance, NOR (negative-OR) flash memory is a type of flash memory that offers access to individual bytes for retrieval of data, but that has relatively low density.

In contrast, NAND flash memory is a type of flash memory that offers relatively high density that is achieved in part by forming columns of cells connected in series. Additionally, data may be programmed and accessed in relatively large groups of bytes, such as a page or block of data. For example, a block can correspond to a row or to a portion of a row in an array. Data is typically written to and read from a NAND flash memory array a block of data at a time. For example, a block can have 2,112 bytes of which 2,048 are data bytes and 64 are spare bytes. The spare bytes are typically used for error correction codes (ECC), wear-leveling information, or other overhead data. Error correction codes can increase the robustness of the stored data. Typically, a form of block code is used to generate the error correction codes, such as cyclic redundancy check (CRC) checksums, Hamming codes, Reed-Solomon error correction, or the like. These error correction codes detect if there were errors in the reading of the data bytes and can typically correct errors in the data bytes provided that the errors do not exceed the capability of the error correction code.

One example of NAND flash memory is as a flash file system in an embedded system. An embedded system is a computer system (e.g., including an integrated circuit on a printed circuit board (PCB)) with a dedicated function within a larger mechanical or electrical system (e.g., servers, mobile phones, digital cameras, etc.). Embedded systems are designed to perform a specific task rather than functioning as a general-purpose computer for multiple tasks. Some also have real-time performance constraints that must be met, for reasons such as safety and usability; others may have low or no performance requirements, allowing the system hardware to be simplified to reduce costs. For instance, the flash file system may be used for storing files, embedded program instructions, and the like. In some arrangements, the flash file system may be used with a controller to perform wear leveling and error correction.

SUMMARY

Existing systems are capable of detecting that NAND flash device blocks have gone bad (e.g., due to errors that occur during writing and/or reading operations) and reporting such information to a service processor of the system (e.g., the embedded system in which the NAND flash device is incorporated) by way of writing corresponding log files to one or more dedicated corresponding blocks of the device. Furthermore, NAND flash devices are typically configured with a particular number of "allowable" bad blocks or in other words a number of bad blocks (e.g., blocks containing one or more invalid bits whose reliability may not be guaranteed) that may be detected in the device before the device completely fails. Different vendors or manufactures will often configure the devices with a different particular number of allowable bad blocks.

On each NAND device, for instance, a number of blocks equal to the number of allowable bad blocks may be set aside such that when a bad block is encountered, one of the set aside blocks may instead be used to write data rather than the encountered bad block. Once the final bad block has been detected (i.e., such that the total number of bad blocks encountered over the life of the NAND device equals the allowable bad block quantity), the device often becomes read-only and all future write attempts fail. In some situations, the NAND flash device may fail in such a way that the service processor or the like cannot even be alerted of the failure (e.g., due to the inability to write additional log files about the failure to remaining blocks of the device).

In this regard, disclosed herein are methods, systems, and devices (e.g., utilities) for use in actively detecting the occurrence of bad blocks in NAND flash storage devices and diagnosing the devices as "faulty" at some point before complete failure of the devices (e.g., before the number of allowable bad blocks has been reached) to allow a corresponding service processor to continue to write to available blocks for a period of time until a replacement NAND flash device can be identified (e.g., such as to write log files indicative of errors causing the bad blocks to available blocks which may be analyzed by technicians to determine what caused the blocks to go "bad" and service the NAND flash device). Broadly, the disclosed utilities may be configured to actively (e.g., continuously) monitor a total current number of bad blocks of a NAND flash device relative to the allowable bad block count during normal use of the device (e.g., when it is incorporated into an embedded system and being utilized by a customer) and generate an alert (e.g., report, message, etc.) when the total current bad block number has reached or exceeded a particular threshold percentage (e.g., 80%, 90%, etc.) of the allowable bad block count but before the total current bad block number has reached 100% of the allowable bad block count. Advantageously, service of the device can be scheduled at a convenient time before occurrence of a catastrophic failure which increases the reliability and availability of the computer system incorporating or utilizing the device.

The disclosed utilities may also be utilized to predict the future occurrence of bad blocks in NAND flash devices, such as during the "burn-in" process of the devices (e.g., which tests the quality of the NAND flash device before being placed into service to weed out devices with defects). Broadly, the disclosed utilities may be configured to determine whether a number of bad blocks encountered during a manufacturer burn-in period of a NAND flash device indicates that the device would likely fail during the useful lifetime of the device (or in other words, whether a rate of block degradation during the burn-in period is higher than a threshold rate). For instance, the disclosed utilities may be configured to actively (e.g., continuously) monitor a total current number of bad blocks of a NAND flash device relative to the allowable bad block count during the burn-in period and generate an alert (e.g., report, message, etc.) when the total current bad block number has reached or exceeded a particular threshold percentage of the allowable bad block count during the burn-in period.

The particular threshold percentage can be selected based on the length of the burn-in period such that reaching or exceeding the particular threshold percentage indicates that the NAND flash device is degrading at a higher than acceptable rate. In the case where a burn-in process has different phases of different lengths, different threshold percentages can be applied to the different phases. As just one example, a first threshold percentage (e.g., 2%) may be applied to a first phase of a burn-in (e.g., Board Function Test (BFT)) that lasts a first period of time (e.g., a couple hours) while a higher second threshold percentage (e.g., 8%) may be applied to a second phase of a burn-in (e.g., System Function Test (SFT)) that lasts a greater second period of time.

In one arrangement, an initial bad block count of a NAND flash device (e.g., a number of bad blocks in the device before start of the burn-in period) may be determined and subtracted from the total current number of bad blocks and the total allowable number of bad blocks before each respective determination of the percentage of the total allowable number of bad blocks represented by the total current number of bad blocks. Accordingly, the disclosed utilities may be configured to determine a percentage increase in total allowable bad block percentage since an initial boot of a service processor utilizing the NAND flash device.

In one aspect, a method for use with a non-volatile storage device includes obtaining a count of allowable bad blocks for an array of a non-volatile storage device ("allowable bad block count"), obtaining a count of blocks in the array that have been marked as being bad blocks ("current bad block count"), determining, with a processor, a percentage of the allowable bad block count represented by the current bad block count ("allowable bad block percentage"), ascertaining, with the processor, whether the allowable bad block percentage is greater than a threshold percentage, and generating a message based on a result of the ascertaining step. The count of allowable bad blocks equals a count of blocks in the non-volatile storage device set aside to receive data intended for a block marked as being a bad block, and each block marked as being a bad block contains one or more invalid bits.

For instance, the method may further include obtaining a total count of blocks in the array that have been marked as being bad blocks ("total current bad block count"); obtaining a total count of allowable bad blocks for the array ("total allowable bad block count"); and obtaining a count of blocks in the array that were marked as being bad blocks upon an initial boot of an operating system of the processor ("initial bad block count"), where the current bad block count is the difference between the total current bad block count and the initial bad block count, and where the allowable bad block count is the difference between the total allowable bad block count and the initial bad block count.

As another example, the method may include conduct a burn-in test of the array of the non-volatile storage device, where the steps of obtaining the current bad block count, determining the allowable bad block percentage, ascertaining, and generating are performed during the conducting step. For instance, the generating step may include generating a message when the processor ascertains that the allowable bad block percentage is greater than the threshold percentage, where the message indicates diagnosis of a fault in the non-volatile storage device. As another example, the conducting step may include first conducting a first phase of the burn-in test, wherein the threshold percentage is a first threshold percentage during the first conducting step; and second conducting a second phase of the burn-in test, where the threshold percentage is a second threshold percentage during the second conducting step.

In another aspect, an embedded system include a printed circuit board (PCB); a NAND flash storage device mounted on the PCB, where the NAND flash storage device comprises a memory array that includes a series of blocks for storing data; and a processor mounted on the PCB in electrical communication with the NAND flash storage device. The processor executes a service manager that determines whether a current percentage of a count of allowable bad blocks for the series of blocks ("allowable bad block count") represented by a current count of bad blocks in the series of blocks ("current bad block count") has reached or exceeded a threshold percentage of the allowable bad block count, and generates a message when the current percentage has reached or exceeded the threshold percentage. Each bad block contains one or more invalid bits and the allowable bad block count equals a count of blocks in the series of blocks that are set aside to receive data intended for a bad block.

In a further aspect, a method includes first conducting a first phase of a burn-in test on a NAND flash storage device that includes a storage array with a series of blocks for storing data; first determining, during the first conducting step, whether a current percentage of a count of allowable bad blocks for the series of blocks ("allowable bad block count") represented by a current count of bad blocks in the series of blocks ("current bad block count") has reached or exceeded a first threshold percentage of the allowable bad block count; second conducting, after the first conducting step, a second phase of a burn-in test on the NAND flash storage device; second determining, during the second conducting step, whether the current percentage has reached or exceeded a second threshold percentage of the allowable bad block count; and generating at least one message when the current percentage reaches or exceeds the first threshold percentage during the first conducting step or the second threshold percentage during the second conducting step. Each bad block contains one or more invalid bits and the allowable bad block count equals a count of blocks in the series of blocks that are set aside to receive data intended for a bad block.

In addition to the exemplary aspects and embodiments described above, further aspects and embodiments will become apparent by reference to the drawings and by study of the following descriptions.

DETAILED DESCRIPTION

The present disclosure is generally directed to systems, apparatuses, and methods (e.g., utilities) that are configured to actively detect the occurrence of bad blocks in NAND flash storage devices and diagnose the devices as "faulty" at some point before complete failure of the devices (e.g., before the number of allowable bad blocks has been reached) to allow a corresponding service processor to continue to write to available blocks for a period of time until a replacement NAND flash device can be identified (e.g., such as to write log files indicative of errors causing the bad blocks to available blocks which may be analyzed by technicians to determine what caused the blocks to go "bad" and service the NAND flash device). The present disclosure is also directed to utilities that can predict the future occurrence of bad blocks in NAND flash devices, such as during the "burn-in" process of the devices so as to isolate defective devices before being put into use.

Figure 1:
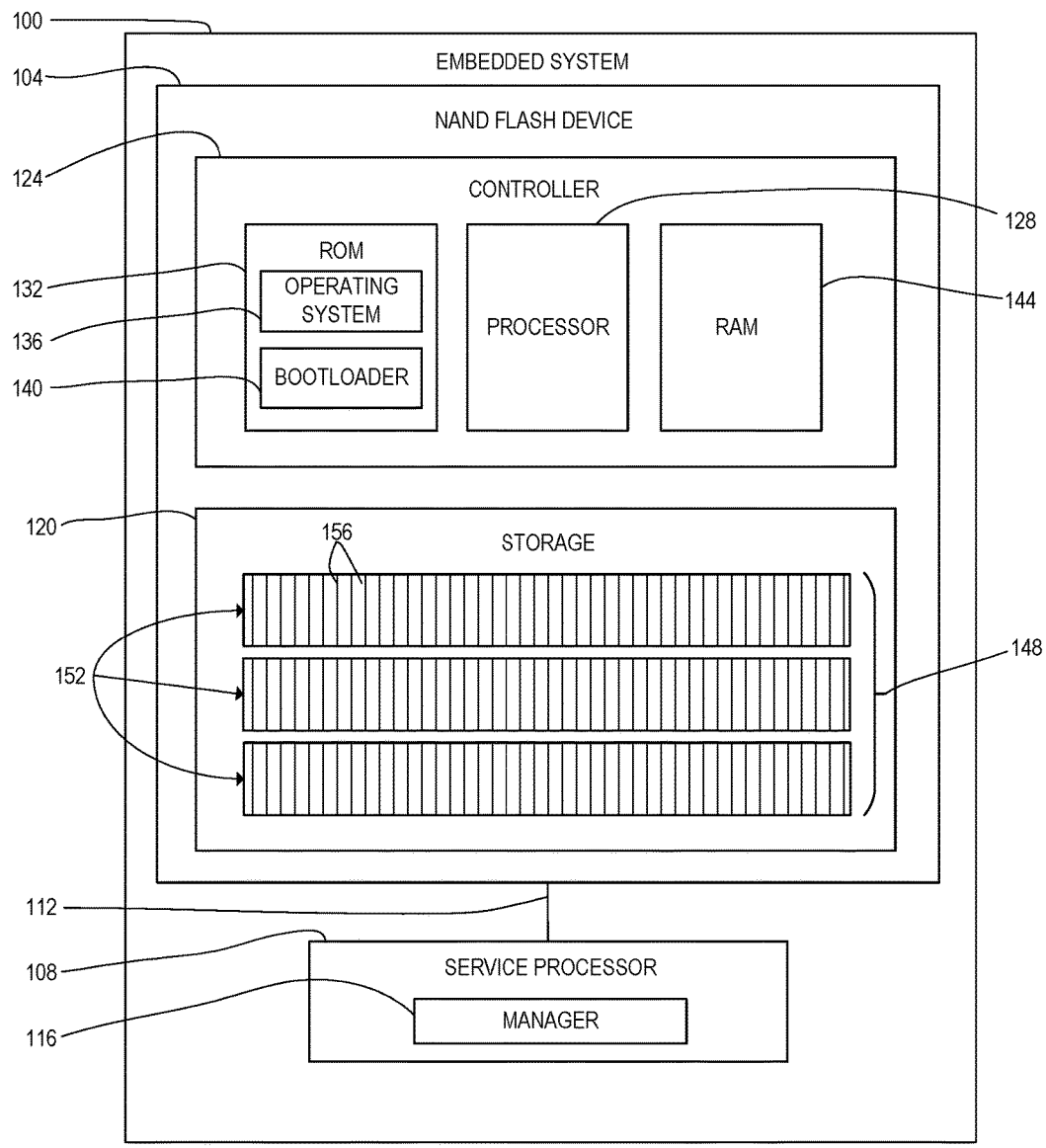
FIG. 1 is a block diagram of an embedded system that includes a NAND flash device and service processor according to one embodiment.

With initial reference to FIG. 1, a block diagram of an embedded system 100 according to one embodiment is disclosed that includes a NAND flash device 104 coupled to an out of band processing device such as a service processor 108 (e.g., processing device(s)/unit(s)) by any appropriate NAND bus 112. The NAND flash device 104, service processor 108, etc. may be mounted onto any appropriate printed circuit board (PCB) or the like. The service processor 108 may execute a manager 116 (e.g., software including any appropriate computer-readable instructions) that is configured to write to and/or read from the NAND flash device 104 in any appropriate manner and for any appropriate purposes. As discussed previously, the embedded system 100 may be incorporated into any appropriate larger electromechanical system or the like and further details regarding the same are not included herein in the interest of clarity.

Broadly, the NAND flash device 104 may include a non-volatile storage region 120 as well as a controller 124 that manages access to the storage region 120 as well as facilitating communication with other components of the embedded system (e.g., with the service processor 108). For instance, the controller may include a processor 128 (e.g., processing device(s), processing unit(s)), a read-only memory (ROM) 132 including an embedded operating system (OS) 136 for the purpose of running various functionality of the service processor 108 and a bootloader 140 for booting and self-testing of the embedded OS 136 (e.g., as well as performing hardware configuration of the controller 124 and/or the like), and random access memory (RAM) 144 for use in storing computer-readable instructions to be executed by the processor 128.

The storage region 120 may broadly include a non-volatile storage array 148 that allows data to be written, retrieved and erased on a block-by-block basis. For instance, the non-volatile memory array 148 may be formed of a series or plurality of individual blocks 152 of memory for storing data and the like, where each block 152 may be formed of a plurality of individual pages 156. If the service processor 108 receives or generates data to be written to the array 148, the service processor 108 may coordinate with the controller 124 to write data to a particular page 156 within a block 152. If the service processor 108 receives or generates a command to read particular data from the array 148, the service processor 108 may coordinate with the controller 124 to read the particular data from a particular page 156 within a block 152. If the service processor 108 receives or generates a command to perform an erase operation, the particular block 152 and/or corresponding pages 156 may be erased.

In one arrangement, the storage array 148 may include a private storage area for storing logs of various system events (e.g., regarding bad block detection), MAC addresses of server management network controllers, and/or the like. The storage array 148 may also include a customer data store for storing system configuration options (e.g., network settings) and/or other data. Additionally or alternatively, the storage array 148 may serve as a file system for storing files, embedded program instructions, and the like. The embedded system of FIG. 1 may be embodied in any appropriate integrated circuit and incorporated into any appropriate host device (e.g., desktop, service, and/or other devices including a CPU) via any appropriate interface.

The controller 124 may be configured in any appropriate manner to detect when one or more blocks 152 of the array 148 have gone "bad" (e.g., blocks containing one or more invalid bits whose reliability may not be guaranteed), such as due to errors that occur during writing and/or reading operations on the array 148. For instance, the controller 124 may be configured to write one or more log files indicative of the one or more detected bad blocks to one or more dedicated blocks 152 of the storage array 148. In one arrangement, the controller 124 may be configured to report the detection of the bad block(s) to the service processor 108 which may proceed to read the corresponding log from the storage array 148 and take any appropriate action. In another arrangement, the service processor 108 may be configured to periodically poll the dedicated blocks 152 of the storage array 148 for logs indicative of detected bad blocks.

The NAND flash device 104 is configured with a particular number of "allowable" bad blocks that may be detected in the array 148 before the device 104 may completely fail. Specifically, the controller 124 or the like may set aside a particular number of blocks 152 equal to the allowable bad block count and that are used to write data that was previously written to or intended to be written to a block 152 determined to be bad. Each time a bad block is detected and the data of the bad block is written to one of the set aside blocks 152, the NAND flash device 104 is one count closer to reaching the particular number of allowable bad blocks specified for the device 104.

As discussed previously, existing NAND flash devices often become read-only once a final allowable bad block has been detected (i.e., such that the total number of bad blocks encountered over the life of the NAND device equals the allowable bad block quantity). As a result, existing NAND flash devices often become read-only and future write attempts fail. In some situations, existing NAND flash devices may fail in such a way that the service processor or the like cannot even be alerted of the failure (e.g., due to the inability to write additional log files about the failure to remaining blocks of the device).

Figure 2:
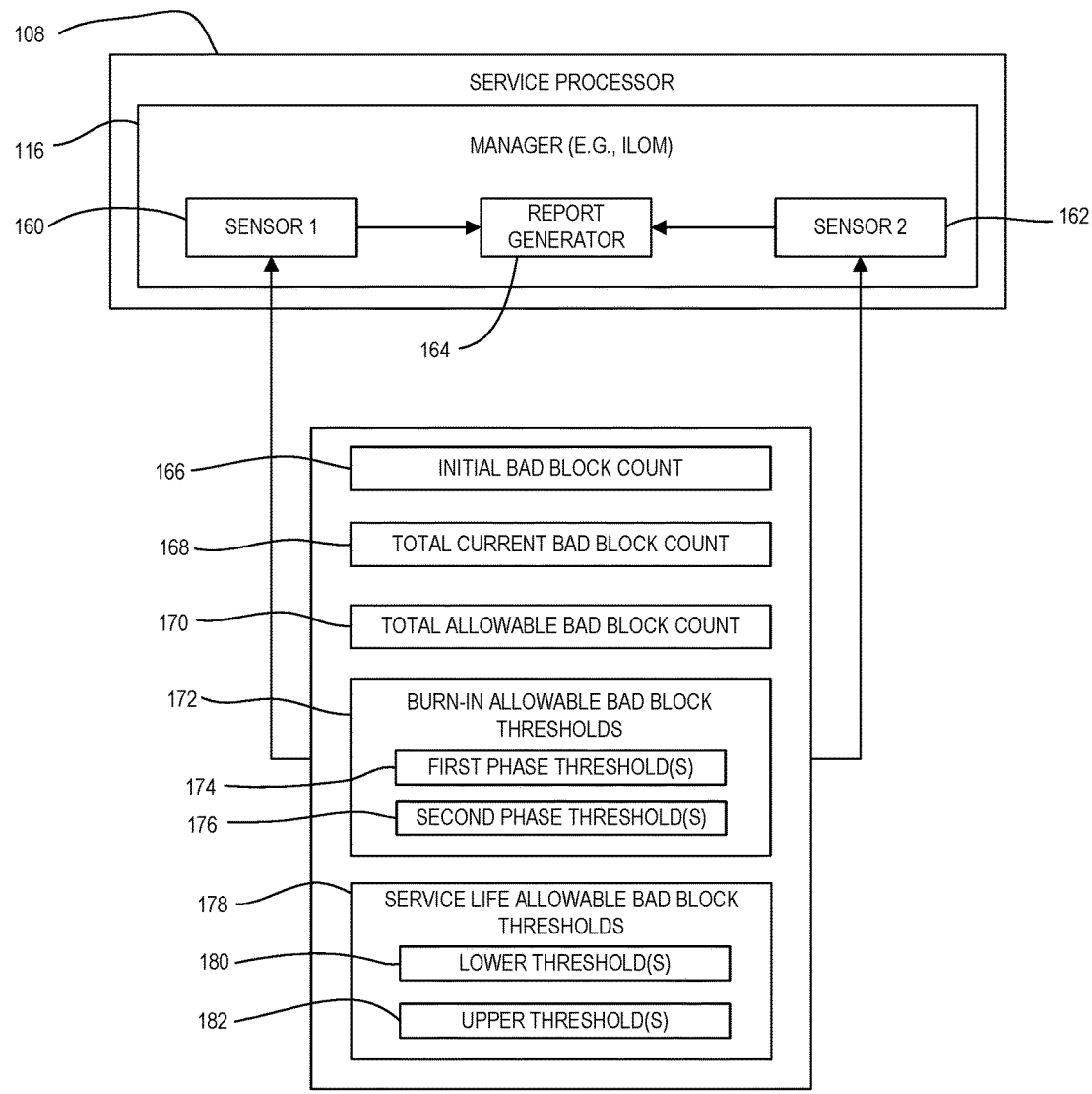
FIG. 2 is a block diagram of a service processor of the system of FIG. 1 and illustrating a number of sensors that are configured to detect whether the NAND flash device is prematurely failing during a burn-in process and whether the NAND flash device is close to but not yet at a complete failure to allow for reporting of the same and salvaging of data on the device while the device is still operational.

With additional reference now to FIG. 2, the manager 116 of the service processor 108 includes one or more "sensors" (e.g., each in the form of one or more sets of computer-readable instructions) broadly configured to detect when a current bad block count of the storage array 148 has reached or exceeded one or more threshold percentages of the allowable bad block count as well as a report generator 164 (e.g., in the form of one or more sets of computer-readable instructions) configured to alert a user, component and/or process of the same. As an example, the manager 116 may include a first sensor 160 that is configured to predict the future occurrence of bad blocks in the storage array 148 of the device 104, such as during the "burn-in" process of the device 104 (e.g., which tests the quality of the device 104 before being placed into service). The manager 116 may also include a second sensor 162 that is configured to detect, during the service life of a device 104, when the device 104 is close to becoming but has not yet reached a completely failed state to allow the manager 116 or the like (e.g., the controller 124) to continue to write to available blocks 152 of the array 148 for a period of time until a replacement NAND flash device 104 can be identified. While particular functionality of the first and second sensors 160, 162 will now be discussed in more detail, the manager 116 may implement one or more other sensors for use in sensing the occurrence of one or more other bad block metrics.

To facilitate discussion of the functionality of the first sensor 160, additional reference will now be made to FIG. 3 which presents a flow diagram of a method 200 of detecting premature failing of a NAND flash device during a burn-in process on the device. Specifically, the method 200 may be executed according to any appropriate frequency during one or more phases of the burn-in process. At steps 204 and 208 respectively, the method 200 may include obtaining an initial bad block count 166 and obtaining a total allowable bad block count 170 in relation to the storage array 148. For instance, the initial bad block count 166 may represent the number or quantity of bad blocks in the storage array 148 before start of the burn-in process on the device 104 and may be determined by the controller 124 or the like. The total allowable bad block count 170 may represent the total number or quantity of blocks set aside from normal writing to receive data from a bad block (e.g., and which may be specific to the manufacturer of the device 104).

In one arrangement, the counts 166, 170 may be written (e.g., by the controller 124, service processor 108, and/or the like) to one or more dedicated blocks 152 of the storage array 148 for access by the sensor 160 during the steps 204, 208 of the method 200. For instance, one or both of the counts 166, 170 may be stored in a u-boot environment variable in one or more blocks 152 of the array 148 (so as to remain persistent) and then loaded into RAM (e.g., RAM 144 and/or other RAM or cache) at the first boot of the service processor 108. Additionally or alternatively, the counts 166, 170 may be stored in one or more other locations or regions accessible by the manager 116 such as in the ROM 132 or the like. In any case, the method 200 of FIG. 3 may then include subtracting 212 the initial bad block count 166 from the total allowable bad block count 170 to obtain an allowable bad block count (e.g., an "adjusted" allowable bad block count) and store the same (at least temporarily) in RAM or the like for reasons as discussed below.

The method 200 may also include obtaining 216 a total current bad block count 168, subtracting the initial bad block count 166 from the total current bad block count 168 to obtain a current bad block count (e.g., an "adjusted current bad block count"), and storing the same (at least temporarily) in RAM or the like. As discussed previously, the controller 124 may be configured to appropriately detect the occurrence of bad blocks in the storage array 148 and write log files regarding the same to one or more blocks 152 of the array 148. Additionally, the controller 124, the service processor 108, and/or the like may be configured maintain a total current count (e.g., quantity) of bad blocks (i.e., the total current bad block count 168) of the array 148 and record or store the same in a block 152 of the array 148 and/or other location (e.g., by way of updating a total count of bad blocks each time a new log file indicative of a new bad block is detected or otherwise reported) for retrieval by the first sensor 160 as part of step 216 of the method 200.

Figure 3:
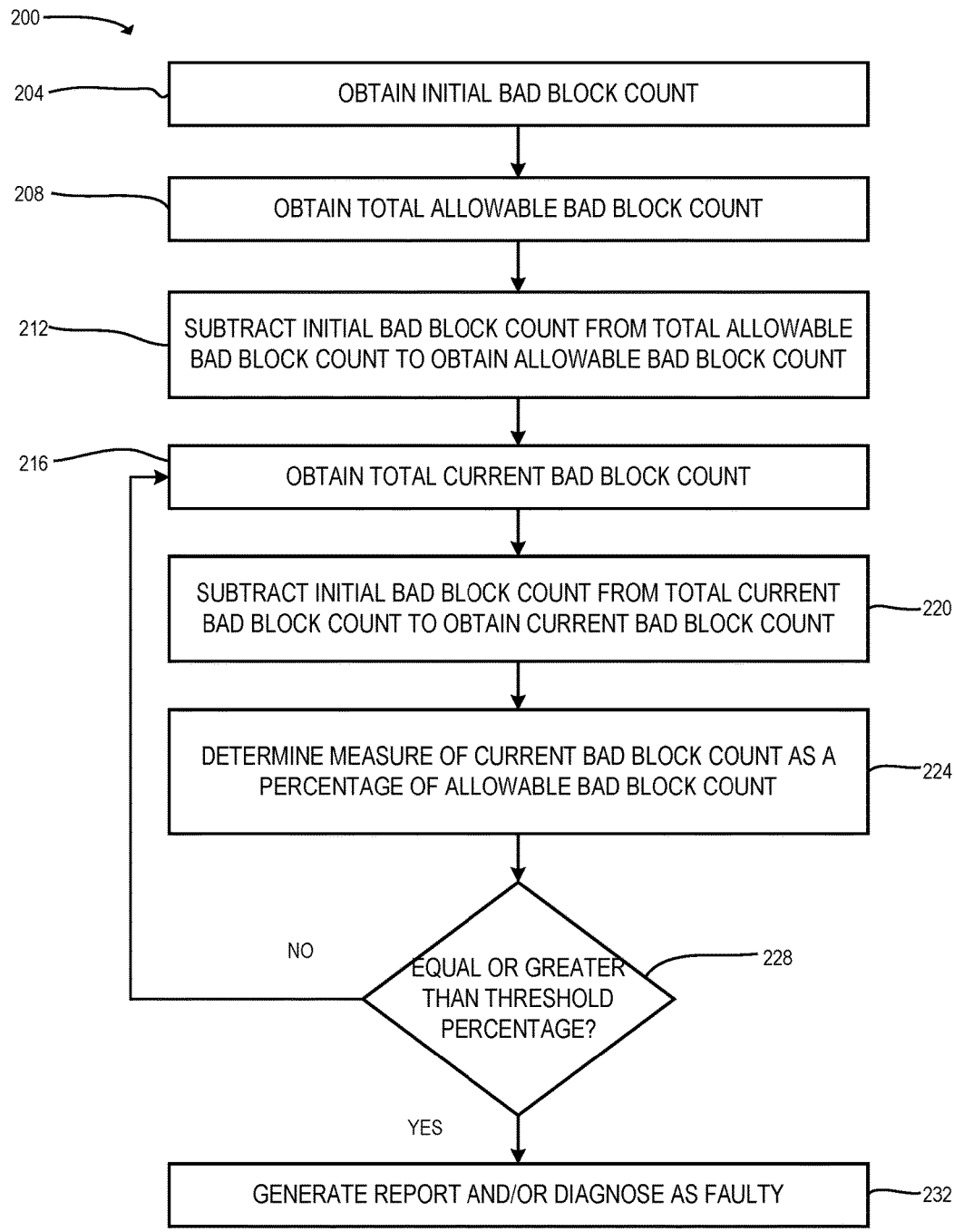
FIG. 3 is a flow diagram of a method of detecting premature failing of a NAND flash device during a burn-in process on the device.

With continued reference to FIG. 3, the method 200 may then include determining 224 a measure of the (adjusted) current bad block count as a percentage of the (adjusted) allowable bad block count. In other words, the method 200 may include determining 224 what percentage of the adjusted allowable bad block count is represented by the adjusted current bad block count. As the initial bad block count 166 was subtracted from each of the total current and allowable bad block counts 168, 170 before the determining step 224, the determined resulting percentage represents a percentage increase in the percentage of allowable bad blocks used during the burn-in testing operation. The method 200 may then query 228 whether the determined percentage is equal to or greater than a particular predefined threshold percentage 172, where the predefined threshold percentage 172 may be selected at least partially as a function of a length of time of the burn-in test or phase thereof such that reaching or exceeding the particular threshold percentage 172 indicates that the NAND flash device 104 (e.g., the storage array 148) is degrading at a higher than acceptable rate and that the device 104 would likely fail during its service lifetime if shipped for implementation into a another device.

In one arrangement, different respective threshold percentages 172 may be used for different respective phases or periods of a burn-in testing operation on a NAND flash device 104. As an example, a first threshold percentage 174 may be applied to a first phase of a burn-in testing operation (e.g., Board Function Test (BFT)) that lasts a first period of time while a different second threshold percentage 176 may be applied to a second phase of a burn-in testing operation (e.g., System Function Test (SFT)) that lasts a different second period of time that is non-overlapping with the first period of time. For instance, the first phase threshold 174 may be on the order of 2% in the case of the first phase lasting two or so hours while the second phase threshold 176 may be on the order of 8% in the case of the second phase lasting eight or so hours. Users may be able to dynamically modify the first and second (or additional) phase thresholds 174, 176 (e.g., such as by inputting any appropriate command on each boot of the service processor 108) to account for different testing phase durations. The various thresholds 172 may be stored in one or more dedicated blocks 152 of the storage array 148 and/or in one or more other locations.

In response to a negative answer to the query 228, the method 200 may return to obtain 216 the total current bad block 168 and then again continue with the subsequent steps of the method 200. In response to a positive answer to the query 228, the method 200 may proceed to generate 232 a report or other communication and/or diagnose the NAND flash device 104 as faulty to inhibit shipment of a prematurely failing device. Upon the first sensor 160 detecting that the percentage determined at step 224 is equal to or greater than the respective particular threshold percentage 172, for instance, the first sensor 160 may trigger the report generator 164 to generate any appropriate report (e.g., ireport), alert or the like which may be presented to a user on any appropriate user interface in communication with the service processor 108.

Each threshold 172 may be applied during its corresponding respective testing phase. For instance, the first phase threshold 174 may be used in step 228 of the method 200 during the first phase of the burn-in testing operation (e.g., and not during the second phase) and the second phase threshold 176 may be used in step 228 of the method 200 during the second phase of the burn-in testing operation (e.g., and not during the first phase). In the case where the first phase threshold 174 was reached or exceeded during the first phase of the burn-in testing operation and the NAND flash device 104 diagnosed as faulty, the method 200 may end before application of the second (or additional) phase thresholds 176 in the method 200.

Figure 4:
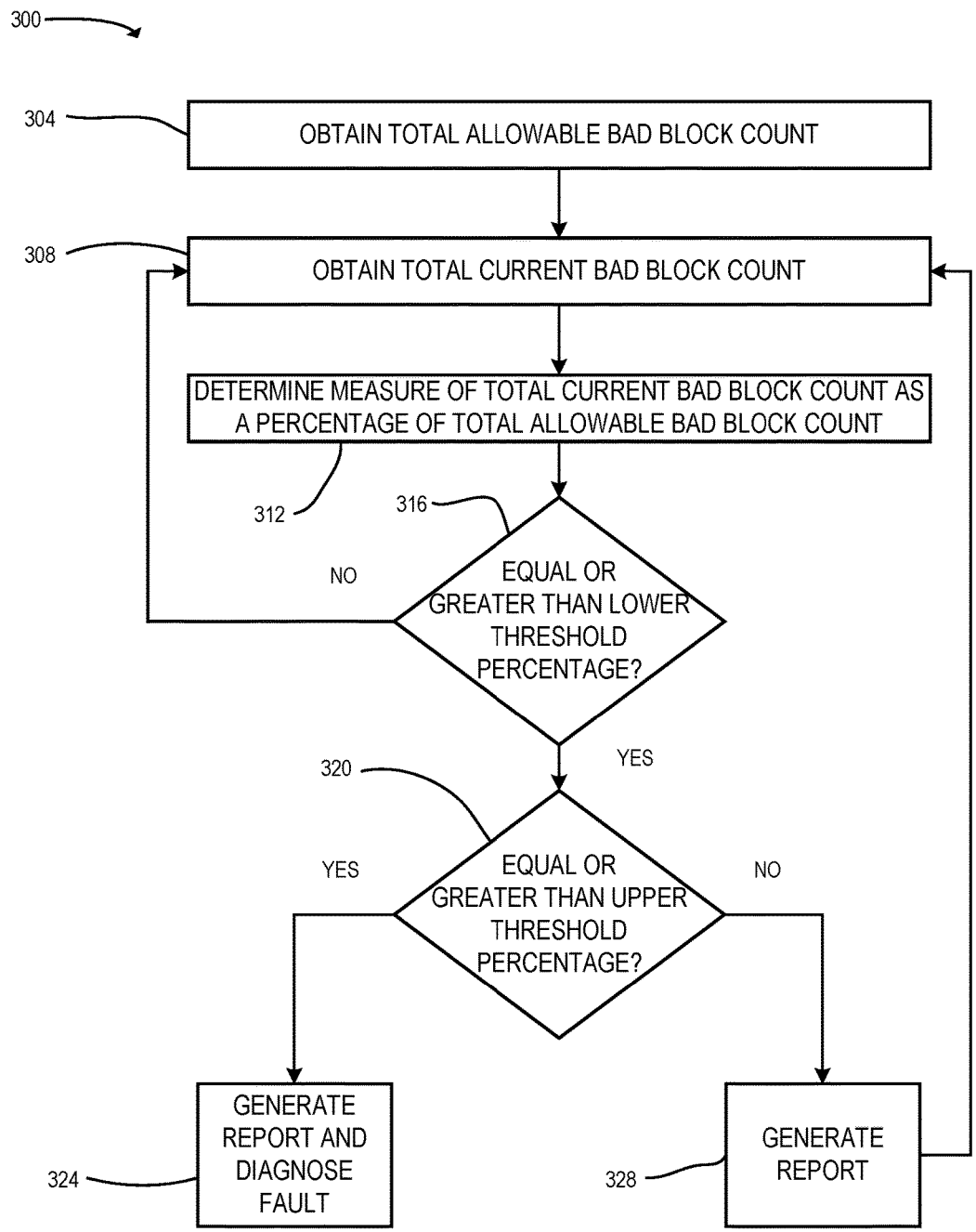
FIG. 4 is a flow diagram of a method of detecting upcoming anticipated failure of a NAND flash device during the service life of the device.

As discussed above, the manager 116 may implement or include additional sensors such as second sensor 162 that is broadly configured to detect, during the service life of the device 104, when the device 104 is close to becoming but has not yet reached a completely failed state to allow the manager 116 or the like (e.g., the controller 124) to continue to write to available blocks 152 of the array 148 for a period of time until a replacement NAND flash device 104 can be identified. To facilitate discussion of the functionality of the second sensor 162, additional reference will now be made to FIG. 4 which presents a flow diagram of a method 300 of detecting upcoming anticipated failure of the NAND flash device 104 during the service life of the device 104. The method 300 may be executed according to any appropriate frequency during the service life of the device 104. At steps 304 and 308 respectively, the method 300 may include obtaining a total allowable bad block count 170 and obtaining a total current bad block count 166 and then querying 316 whether the resulting percentage is equal to or greater than a first/lower threshold percentage 180. For instance, the lower threshold 180 may be a particular percentage (e.g., 50%) of the total allowable bad block count 170 that is chosen to provide a warning regarding the prevalence of an increased number of bad blocks in the NAND flash device 104 but that does not necessarily indicate that a fault needs to be diagnosed.

In response to a negative answer to the query 316, the method 300 may return to obtain 308 the total current bad block 168 and then again continue with the subsequent steps of the method 300. In response to a positive answer to the query 316, the method 300 may proceed to query 320 whether the resulting percentage (from step 316) is equal to or greater than a second/upper threshold percentage 182 that is greater than the lower threshold percentage 180. For instance, the upper threshold 182 may be a particular percentage (e.g., 90%) of the total allowable bad block count 170 that is chosen to indicate that a fault needs to be diagnosed in the NAND flash device 104 at a time before complete failure of the device 104 to allow the manager 116 or the like (e.g., the controller 124) to continue to write to available blocks 152 of the array 148 for a period of time until a replacement NAND flash device 104 can be identified.

In response to a negative answer to the query 320 (i.e., that the percentage determined at 316 is between the lower and upper thresholds 180, 182), the method 300 may proceed to generate 328 a report (e.g., ereport) or the like (e.g., but without diagnosis of a fault) to provide a warning to users regarding an increased number of bad blocks in the NAND flash device 104. In response to a positive answer to the query 320, the method 300 may proceed to generate 328 a report or the like including diagnosis of a fault so that technicians and the like can arrange for repair or replacement of the NAND flash device 104 before complete failure of the same. In one arrangement, diagnosis of a fault may lead to a failover in the embedded system 100 in which the functions being performed by service processor 108 are substantially seamlessly assumed by a secondary service processor or the like.

It will be readily appreciated that many deviations may be made from the specific embodiments disclosed in the specification without departing from the spirit and scope of the invention. Also, it should be understood that the functionalities performed by many of the processes and modules discussed herein may be performed by other modules, devices, processes, etc. The illustrations and discussion herein has only been provided to assist the reader in understanding the various aspects of the present disclosure. Furthermore, one or more various combinations of the above discussed arrangements and embodiments are also envisioned.

In one arrangement, two or more thresholds may be applied during each phase of a burn-in testing operation. As an example, different first/lower and second/upper thresholds may be used during each phase in the method 200 of FIG. 3 similar to the lower and upper thresholds of FIG. 4. For instance, steps 228 and 232 of FIG. 3 may essentially be replaced with steps similar to steps 316 through 328 of FIG. 4 for each phase of the burn-in testing operation. In the case of above example of the first phase in which the first phase threshold was 2%, this lower threshold may be for instance 1.5% (e.g., some percentage of 2%, such as 75% of 2%) while the upper threshold may again be the 2%. Thus, percentages determined at 224 that are between the lower and upper thresholds may result in generation of a report or the like without a fault diagnosis while percentages determined at 224 that are above the upper threshold may result in generation of a report or the like with a fault diagnosis (which may result in disposal of the NAND flash device 104). Of course, various additional thresholds may be included and utilized in the methods 200, 300 such as three or more thresholds. In one arrangement, the reports or the like generated may be coded in any appropriate manner to indicate a level of severity of the current bad block count.

While the thresholds have been discussed in the form of percentages, the present disclosure is not so limited. In one arrangement, for instance, each threshold may be in the form of a count or quantity (similar to the counts 166, 168, 170). In the case of the above example of the lower threshold in the method 300 of FIG. 4, for instance, 50% of the total allowable bad block count may be determined to obtain a specific count, and then the total current bad block count may be directly compared against the specific threshold count. In this regard, the method 300 may proceed from step 308 directed to step 316 whereby the total current block count would be compared against the threshold block count.

It is to be understood that not all components, modules and the like of the embedded system 100, NAND flash device 104, etc. have been shown in the figures in the interest of clarity. Furthermore, the process flows of FIGS. 3-4 have merely been provided as examples and it is to be understood that additional, fewer or different steps may sometimes be utilized without departing from the scope of the present disclosure.

Embodiments disclosed herein can be implemented as one or more computer program products, i.e., one or more modules of computer program instructions encoded on a computer-readable medium for execution by, or to control the operation of, data processing apparatus (processors, cores, etc.). The computer-readable medium can be a machine-readable storage device, a machine-readable storage substrate, a memory device, a composition of matter affecting a machine-readable propagated signal, or a combination of one or more of them. In addition to hardware, code that creates an execution environment for the computer program in question may be provided, e.g., code that constitutes processor firmware, a protocol stack, a database management system, an operating system, or a combination of one or more of them.

A computer program (also known as a program, software, software application, script, or code) used to provide the functionality described herein can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

While this disclosure contains many specifics, these should not be construed as limitations on the scope of the disclosure or of what may be claimed, but rather as descriptions of features specific to particular embodiments of the disclosure. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a sub combination.

We claim:

1. A method for use with a non-volatile storage device, comprising;
   obtaining a count of allowable bad blocks for an array of a non-volatile storage device ("allowable bad block count"), wherein the allowable bad block count equals a count of blocks in the non-volatile storage device set aside to receive data intended for a block marked as being a bad block;
   obtaining a count of blocks in the array that have been marked as being bad blocks ("current bad block count"), wherein each block marked as being a bad block contains one or more invalid bits;
   determining, with a processor, a percentage of the allowable bad block count represented by the current bad block count ("allowable bad block percentage");
   ascertaining, with the processor, whether the allowable bad block percentage is greater than a threshold percentage;
   generating a message based on a result of the ascertaining step;
   conducting a burn-in test of the array of the non-volatile storage device, wherein the steps of obtaining the current bad block count, determining the allowable bad block percentage, ascertaining, and generating are performed during the conducting step, and wherein the conducting step includes:
      first conducting a first phase of the burn-in test for a first length of time, wherein the threshold percentage is a first threshold percentage during the first conducting step, and wherein the first threshold percentage is selected as a function of the first length of time; and
      second conducting a second phase of the burn-in test for a second length of time, wherein the threshold percentage is a second threshold percentage during the second conducting step, wherein the second threshold percentage is selected as a function of the second length of time, and wherein the first and second lengths of time are different.

2. The method of claim 1, wherein the generating step includes generating a message when the processor ascertains that the allowable bad block percentage is greater than the threshold percentage.

3. The method of claim 2, wherein the message indicates diagnosis of a fault in the non-volatile storage device.

4. The method of claim 2, further including:
   initiating a failover process for the processor.

5. The method of claim 1, further including:
   obtaining a total count of blocks in the array that have been marked as being bad blocks ("total current bad block count");
   obtaining a total count of allowable bad blocks for the array ("total allowable bad block count"); and
   obtaining a count of blocks in the array that were marked as being bad blocks upon an initial boot of an operating system of the processor ("initial bad block count"), wherein the current bad block count is the difference between the total current bad block count and the initial bad block count, and wherein the allowable bad block count is the difference between the total allowable bad block count and the initial bad block count.

6. The method of claim 1, wherein the generating step includes generating a message when the processor ascertains that the allowable bad block percentage is greater than the threshold percentage, and wherein the message indicates diagnosis of a fault in the non-volatile storage device.

7. The method of claim 1, wherein:
   during the first conducting step, the ascertaining step includes ascertaining whether the allowable bad block percentage is greater than an upper first threshold percentage and/or a lower first threshold percentage, wherein the generating step includes generating a message without an indication of a fault when the allowable bad block percentage is greater than the upper first threshold percentage but not greater than the lower first threshold percentage, and wherein the generating step includes generating a message with an indication of a fault when the allowable bad block percentage is greater than the upper first threshold percentage and the lower first threshold percentage; and
   during the second conducting step, the ascertaining step includes ascertaining whether the allowable bad block percentage is greater than an upper second threshold percentage and/or a lower second threshold percentage, wherein the generating step includes generating a message without an indication of a fault when the allowable bad block percentage is greater than the lower second threshold percentage but not greater than the upper second threshold percentage, and wherein the generating step includes generating a message with an indication of a fault when the allowable bad block percentage is greater than the lower second threshold percentage and the upper second threshold percentage.

8. A method, comprising:

first conducting a first phase of a burn-in test on a NAND flash storage device that includes a storage array with a series of blocks for storing data;

first determining, during the first conducting step, whether a current percentage of a count of allowable bad blocks for the series of blocks ("allowable bad block count") represented by a current count of bad blocks in the series of blocks ("current bad block count") has reached or exceeded a first threshold percentage of the allowable bad block count, wherein each bad block contains one or more invalid bits, and wherein the allowable bad block count equals a count of blocks in the series of blocks that are set aside to receive data intended for a bad block;

second conducting, after the first conducting step, a second phase of a burn-in test on the NAND flash storage device;

second determining, during the second conducting step, whether the current percentage has reached or exceeded a second threshold percentage of the allowable bad block count; and generating at least one message when the current percentage reaches or exceeds the first threshold percentage during the first conducting step or the second threshold percentage during the second conducting step.

9. The method of claim 8, wherein a length of the first phase is different than a length of the second phase.

10. The method of claim 8, wherein the first and second threshold percentages are different.

11. The method of claim 8, further including:

obtaining a total count of blocks in the storage array that have been marked as being bad blocks ("total current bad block count");

obtaining a total count of allowable bad blocks for the storage array ("total allowable bad block count"); and obtaining a count of blocks in the storage array that were marked as being bad blocks upon an initial boot of an operating system of the NAND flash storage device, wherein the current bad block count is the difference between the total current bad block count and the initial bad block count, and wherein the allowable bad block count is the difference between the total allowable bad block count and the initial bad block count.

12. The method of claim 8, wherein the first determining includes first determining whether the current percentage is greater than an upper first threshold percentage and/or a lower first threshold percentage, wherein the generating step includes generating a message without an indication of a fault when the current percentage is greater than the upper first threshold percentage but not greater than the lower first threshold percentage, and wherein the generating step includes generating a message with an indication of a fault when the current percentage is greater than the upper first threshold percentage and the lower first threshold percentage.

13. The method of claim 12, wherein the second determining includes second determining whether the current percentage is greater than an upper second threshold percentage and/or a lower second threshold percentage, wherein the generating step includes generating a message without an indication of a fault when the current percentage is greater than the upper second threshold percentage but not greater than the lower second threshold percentage, and wherein the generating step includes generating a message with an indication of a fault when the current percentage is greater than the upper second threshold percentage and the lower second threshold percentage.

* * * * *